US011316106B2

(12) United States Patent
Wang et al.

(10) Patent No.: US 11,316,106 B2
(45) Date of Patent: Apr. 26, 2022

(54) RESISTIVE RANDOM ACCESS MEMORY AND MANUFACTURING METHOD THEREOF

(71) Applicant: Winbond Electronics Corp., Taichung (TW)

(72) Inventors: Chung-Hsuan Wang, Taichung (TW); Yu-Ting Chen, Taichung (TW); Tz-Hau Guo, Taichung (TW); Chang-Hsuan Wu, Taichung (TW); Chiung-Lin Hsu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 29 days.

(21) Appl. No.: 17/109,147

(22) Filed: Dec. 2, 2020

(65) Prior Publication Data
US 2021/0193918 A1  Jun. 24, 2021

(30) Foreign Application Priority Data
Dec. 24, 2019   (TW) ................................ 108147399

(51) Int. Cl.
*H01L 45/00*    (2006.01)
*H01L 27/24*    (2006.01)

(52) U.S. Cl.
CPC ...... *H01L 45/1206* (2013.01); *H01L 27/2409* (2013.01); *H01L 27/2463* (2013.01); *H01L 45/08* (2013.01); *H01L 45/1246* (2013.01); *H01L 45/16* (2013.01)

(58) Field of Classification Search
CPC ....................................................... H01L 45/00
See application file for complete search history.

(56) References Cited

U.S. PATENT DOCUMENTS

| 9,865,814 | B2 | 1/2018 | Fest et al. |
| 2010/0090187 | A1 | 4/2010 | Ahn et al. |
| 2011/0147692 | A1 | 6/2011 | Park et al. |
| 2013/0168634 | A1 | 7/2013 | Lee |
| 2016/0315257 | A1 | 10/2016 | Fest et al. |

FOREIGN PATENT DOCUMENTS

| TW | 201519485 | 5/2015 |
| TW | 201924024 | 6/2019 |

*Primary Examiner* — Marvin Payen
(74) *Attorney, Agent, or Firm* — JCIPRNET (57) ABSTRACT

Provided are a resistive random access memory and a manufacturing method thereof. The resistive random access memory includes first, second, and third electrodes, a variable resistance layer, a selection layer, and first and second bit lines. The second electrode and the third electrode are on the first electrode. The second and third electrodes are separated from each other and overlapped with the sidewall and the top surface of the first electrode. The variable resistance layer is between the first and second electrodes and between the first and third electrodes. The selection layer is between the variable resistance layer and the first electrode. The first bit line is on the second electrode and electrically connected to the second electrode via a first contact. The second bit line is on the third electrode and electrically connected to the third electrode via a second contact.

10 Claims, 7 Drawing Sheets

RESISTIVE RANDOM ACCESS MEMORY AND MANUFACTURING METHOD THEREOF

CROSS-REFERENCE TO RELATED APPLICATION

This application claims the priority benefit of Taiwan application serial no. 108147399, filed on Dec. 24, 2019. The entirety of the above-mentioned patent application is hereby incorporated by reference herein and made a part of this specification.

BACKGROUND OF THE INVENTION

Field of the Invention

The invention relates to a memory and a fabrication method thereof, and more particularly, to a resistive random access memory (RRAM) and a manufacturing method thereof.

Description of Related Art

Resistive random access memory has advantages such as fast operation speed and low power consumption, and has therefore become a widely studied non-volatile memory in recent years. Generally, a resistive random access memory includes an upper electrode, a lower electrode, and a variable resistance layer located between the upper electrode and the lower electrode. When a voltage is applied to the upper electrode and the lower electrode, a conductive path (commonly referred to as a conductive filament (CF)) may be formed in the variable resistance layer for set operation, or the conductive path may be disconnected for reset operation to provide related memory functions.

In order to achieve high memory capacity under the same area, a structure (1TnR) in which a single transistor is connected to a plurality of memory cells at the same time is developed. For such a high-density resistive random access memory, an issue of sneak current leakage occurs, thus causing adjacent memory cells to affect each other during operation, leading to reliability decline.

SUMMARY OF THE INVENTION

The invention provides a resistive random access memory, wherein a second electrode and a third electrode disposed on a first electrode and separated from each other are each electrically connected to different bit lines.

The invention provides a manufacturing method of a resistive random access memory used for manufacturing the resistive random access memory.

The resistive random access memory of the invention includes a first electrode, a second electrode, a third electrode, a variable resistance layer, a selection layer, a first bit line, and a second bit line. The first electrode is disposed on the substrate. The second electrode and the third electrode are disposed on the first electrode, wherein the second electrode and the third electrode are separated from each other and are each overlapped with a sidewall and a top surface of the first electrode. The variable resistance layer is disposed between the first electrode and the second electrode and between the first electrode and the third electrode. The selection layer is disposed between the variable resistance layer and the first electrode. The first bit line is disposed on the second electrode and electrically connected to the second electrode via a first contact. The second bit line is disposed on the third electrode and electrically connected to the third electrode via a second contact.

The manufacturing method of a resistive random access memory of the invention includes the following steps. A first electrode is formed on a substrate. A selection layer is formed on the first electrode. A variable resistance layer is formed on the selection layer. A second electrode and a third electrode separated from each other are formed on the variable resistance layer, wherein the second electrode and the third electrode are each overlapped with a sidewall and a top surface of the first electrode. A first contact is formed on the second electrode. A second contact is formed on the third electrode. A first bit line is formed on the first contact. A second bit line is formed on the second contact.

Based on the above, in the resistive random access memory of the invention, since the second electrode and the third electrode disposed on the first electrode are each electrically connected to different bit lines, the second electrode and the third electrode may independently operate memory cells respectively located on two sides of the first electrode. In addition, since two adjacent memory cells respectively located on two sides of the first electrode are each electrically connected to different bit lines, the two memory cells do not affect each other during operation.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2 is a top view of a resistive random access memory according to the first embodiment of the invention, wherein FIG. 1D is a drawing along section line A-A in FIG. 2.

DESCRIPTION OF THE EMBODIMENTS

Figure 1A:
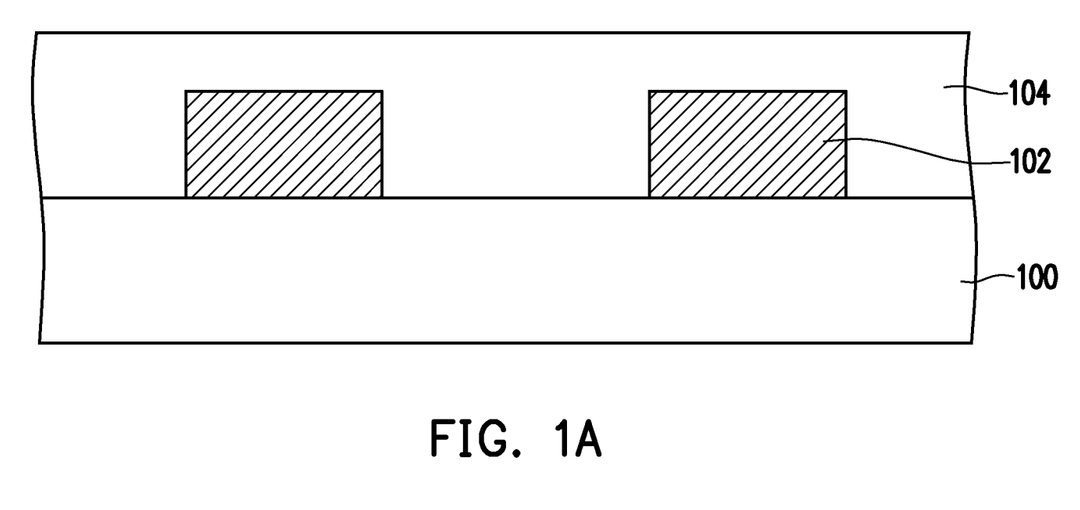
FIG. 1A to FIG. 1D are cross-sectional views of a manufacturing process of a resistive random access memory according to the first embodiment of the invention.

Referring to FIG. 1A, a substrate 100 is provided. In addition, a contact (not shown) is formed in the substrate 100 for connection with an electrode of the resistive random access memory. Then, a first electrode 102 is formed on the substrate 100. The first electrode 102 is connected to the contact. The first electrode 102 is used as a lower electrode of the resistive random access memory. The forming method of the first electrode 102 includes, for example, first forming an electrode material layer on the substrate 100 and then performing a patterning process on the electrode material layer. In the present embodiment, the first electrode 102 is a strip electrode extended on the substrate 100 along a first direction (a direction entering FIG. 1A perpendicularly). In the present embodiment, the material of the first electrode 102 is, for example, Ti, Ta, TiN, TaN, TiAlN, TiW, Pt, Ir, W, Ru, graphite, or a combination thereof. Next, a dielectric layer 104 is formed on the substrate 100. The dielectric layer 104 covers the first electrode 102. In the present embodiment, the dielectric layer 104 is, for example, a silicon oxide layer.

Figure 1B:
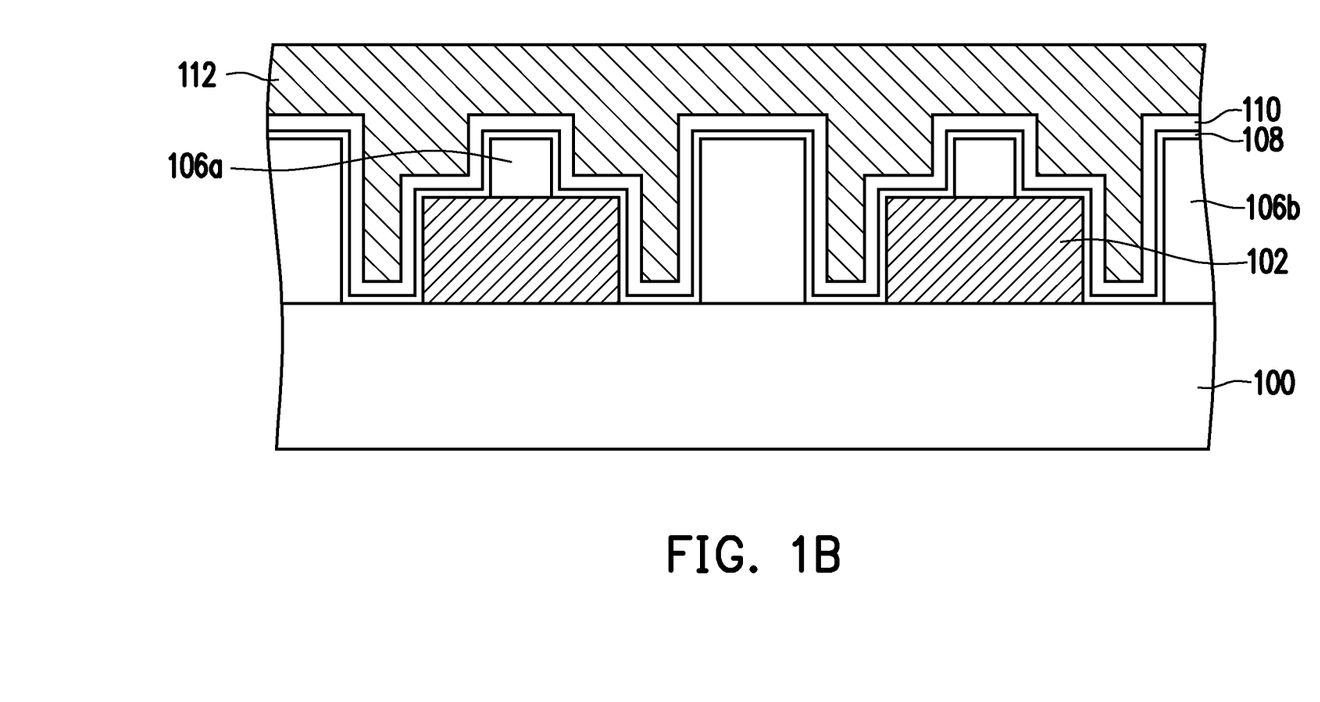

Referring to FIG. 1B, a patterning process is performed on the dielectric layer 104, and a portion of the dielectric layer 104 is removed to form an isolation layer 106a on the top surface of the first electrode 102 and expose the sidewall and a portion of the top surface of the first electrode 102. The isolation layer 106a is used to separate the second electrode and the third electrode formed on the first electrode 102 subsequently. In addition, after the patterning process is performed, in addition to forming the isolation layer 106a on the top surface of the first electrode 102, an isolation layer 106b may also be formed on the substrate 100 between two adjacent first electrodes 102 to separate the two adjacent first electrodes 102. In the present embodiment, the top surface of the isolation layer 106a and the top surface of the isolation layer 106b are coplanar.

Then, a selection layer 108 is formed on the first electrode 102. In the present embodiment, the selection layer 108 is conformally formed on the substrate 100 and covers the substrate 100, the first electrode 102, the isolation layer 106a, and the isolation layer 106b. The forming method of the selection layer 108 includes, for example, performing a chemical vapor deposition process. In the present embodiment, the material of the selection layer 108 is, for example, $Al_2O_3$. Next, a variable resistance layer 110 is formed on the selection layer 108. The forming method of the variable resistance layer 110 includes, for example, performing a chemical vapor deposition process. In the present embodiment, the material of the variable resistance layer 110 is, for example, $HfO_2$, $ZrO_2$, HfZrO, HfAlO, HfON, HfSiO, HfSrO, HfYO, or a combination thereof. Then, an electrode material layer 112 is formed on the variable resistance layer 110. The forming method of the electrode material layer 112 includes, for example, performing a chemical vapor deposition process. In the present embodiment, the material of the electrode material layer 112 is, for example, Ti, Ta, TiN, TaN, TiAlN, TiW, Pt, Ir, W, Ru, graphite, or a combination thereof.

Figure 1C:
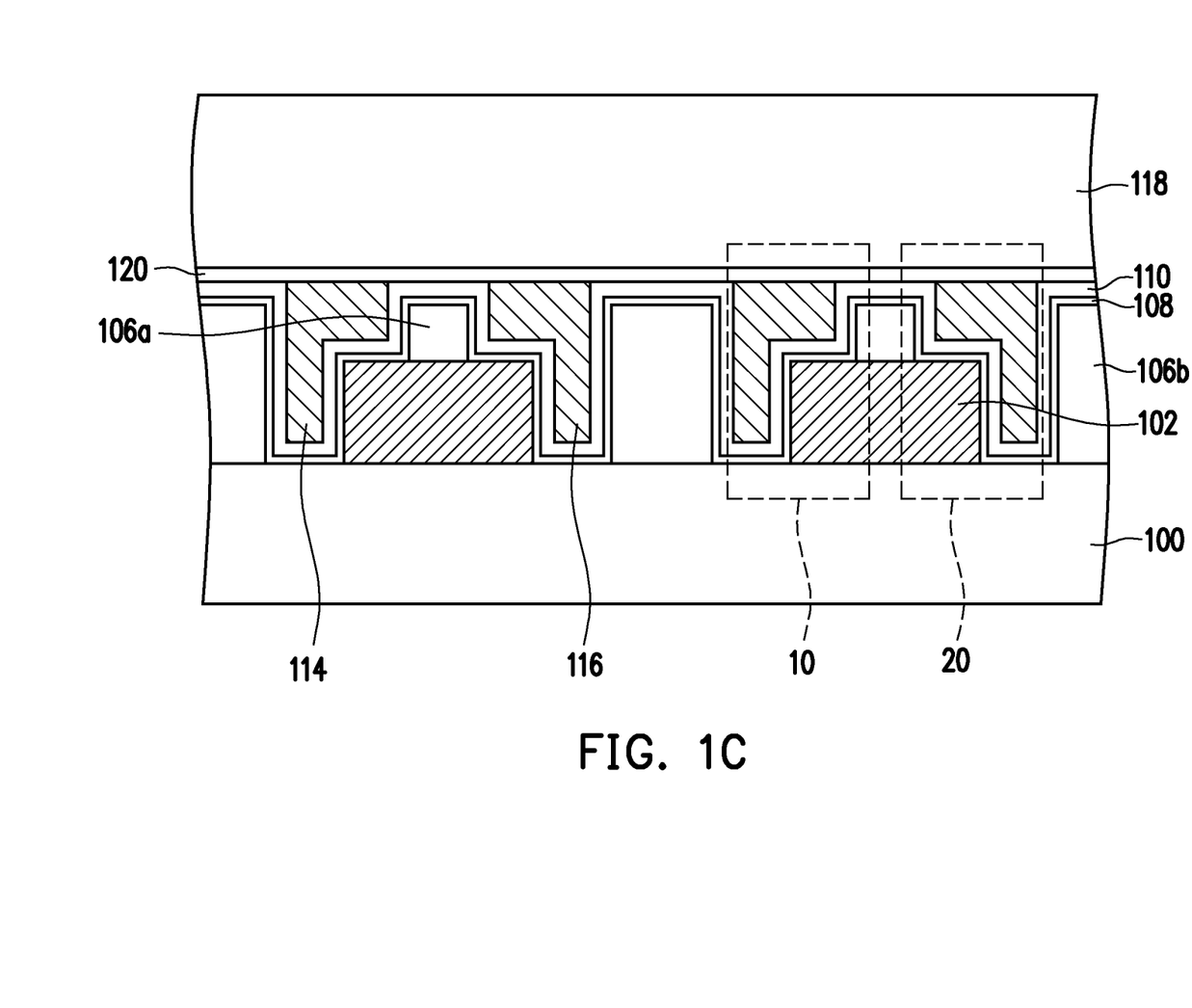

Referring to FIG. 1C, a planarization process is performed, and a portion of the electrode material layer 112 is removed until the variable resistance layer 110 on the isolation layer 106a and the isolation layer 106b is exposed to form the second electrode 114 and the third electrode 116. The planarization process is, for example, a chemical mechanical polishing process. In detail, after the planarization process is performed, the second electrode 114 and the third electrode 116 are respectively formed on two sides of the isolation layer 106a, and the second electrode 114 and the third electrode 116 are each overlapped with the side wall and the top surface of the first electrode 102. As shown in FIG. 1C, the second electrode 114 on the left side of the isolation layer 106a covers the left side wall and a portion of the top surface of the first electrode 102, and the second electrode 116 located on the right side of the isolation layer 106a covers the right side wall and a portion of the top surface of the first electrode 102. In this way, on the left side and the upper side of the first electrode 102, a first memory unit 10 is formed by the first electrode 102 (lower electrode), the second electrode 114 (upper electrode), and the selection layer 108 and the variable resistance layer 110 disposed therebetween, and on the right side and the upper side of the first electrode 102, a second memory unit 20 is formed by the first electrode 102 (lower electrode), the third electrode 116 (upper electrode), and the selection layer 108 and the variable resistance layer 110 disposed therebetween.

In the present embodiment, after the planarization process is performed, the variable resistance layer 110 on the isolation layer 106a and the isolation layer 106b is exposed. That is, in the planarization process, the variable resistance layer 110 is used as a stop layer, but the invention is not limited thereto. In another embodiment, during the planarization process, in addition to removing a portion of the electrode material layer 112, a portion of the variable resistance layer 110 and the selection layer 108 may be removed until the top surface of the isolation layer 106a and the top surface of the isolation layer 106b are exposed. That is, in the planarization process, the isolation layer 106a and the isolation layer 106b are used as stop layers.

In addition, in the present embodiment, the variable resistance layer 110 is used as the stop layer, so that the planarization process is more easily controlled. When the variable resistance layer 110 is used as the stop layer, even if the variable resistance layer 110 above is slightly removed, since the variable resistance layer 110 above is not a main operation region, device performance is not affected. That is, when the variable resistance layer 110 is used as the stop layer, the process window of the planarization process may be increased.

Thereafter, a dielectric layer 118 is formed on the second electrode 114 and the third electrode 116. The forming method of the dielectric layer 118 includes, for example, performing a chemical vapor deposition process. In the present embodiment, the dielectric layer 118 is, for example, a silicon oxide layer. In addition, in order to prevent oxygen atoms in the dielectric layer 118 from diffusing into the variable resistance layer 110 and affecting the operation of the memory, before the dielectric layer 118 is formed, an oxygen blocking layer 120 may be optionally formed on the second electrode 114 and the third electrode 116. The forming method of the oxygen blocking layer 120 includes, for example, performing a chemical vapor deposition process. In the present embodiment, the material of the oxygen blocking layer 120 is, for example, $Al_2O_3$.

Figure 1D:
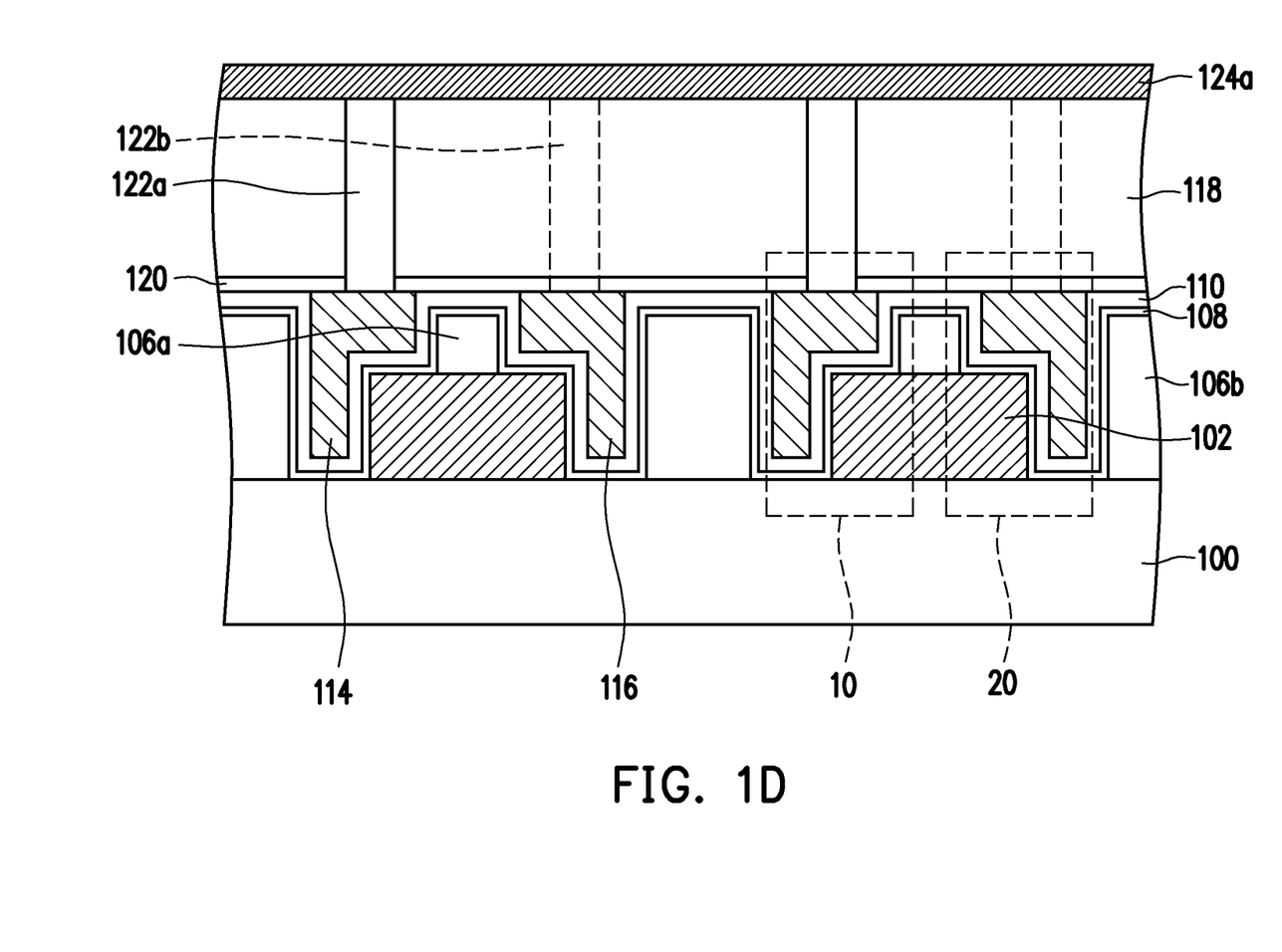
Figure 2:
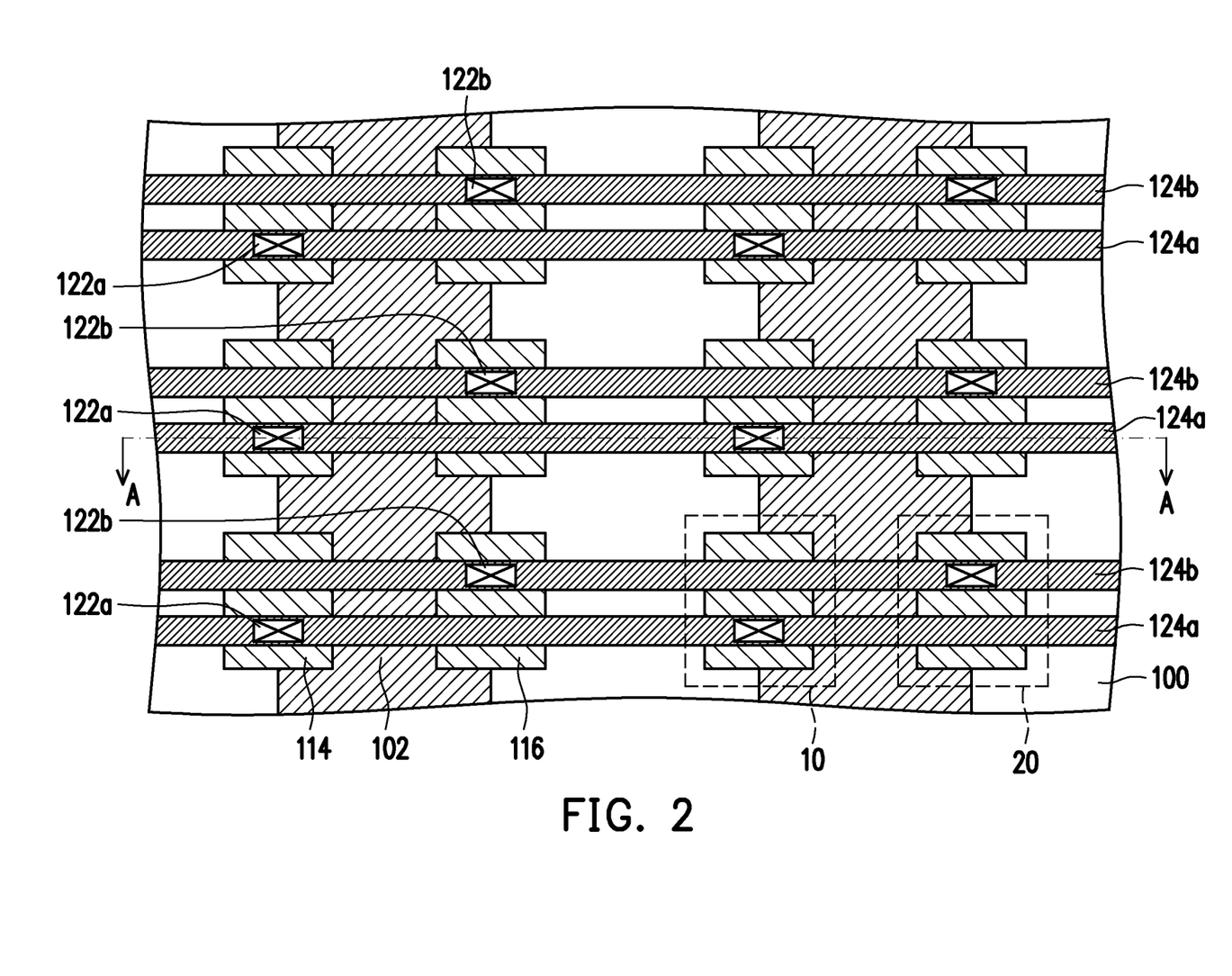

Referring to FIG. 1D, a first contact 122a connected to the second electrode 114 and a second contact 122b connected to the third electrode 116 are formed in the dielectric layer 118. It is important that the first contact 122a and the second contact 122b are staggered, that is, the positions of the first contact 122a and the second contact 122b are not aligned with each other, as shown in FIG. 2. In FIG. 2, for clarity, only the configuration relationship between the substrate 100, the first electrode 102, the second electrode 114, the third electrode 116, the first contact 122a, the second contact 122b, and the bit lines formed subsequently is shown.

Thereafter, a first bit line 124a connected to the first contact 122a and a second bit line 124b connected to the second contact 122b are formed on the dielectric layer 118 to form the resistive random access of the present embodiment. The forming method of the first bit line 124a and the second bit line 124b is known to those skilled in the art and is not repeated herein. In the present embodiment, since the first contact 122a and the second contact 122b are staggered, the first bit line 124a and the second bit line 124b may be disposed parallel to each other in a second direction perpendicular to the first direction.

In the resistive random access memory of the present embodiment, since the second electrode 114 and the third electrode 116 are each electrically connected to different bit lines, the first memory unit 10 and the second memory unit 20 may be independently operated. In addition, since the adjacent first memory unit 10 and second memory unit 20 are each electrically connected to different bit lines, the adjacent memory units do not affect each other during the operation.

In the present embodiment, since the second electrode 114 and the third electrode 116 are each overlapped with the sidewall and the top surface of the first electrode 102, conductive paths (conductive filaments) may be formed in a concentrated manner at the upper left corner and the upper right corner of the first electrode 102. In other words, when the memory units of the present embodiment are operated, the forming positions of the conductive paths (conductive filaments) may be better controlled.

In the present embodiment, the second electrode 114 and the third electrode 116 disposed on the first electrode 102 are separated from each other by the isolation layer 106a, but the invention is not limited thereto. In another embodiment, the isolation layer 106a may also be omitted, which is further described below.

Figure 3A:
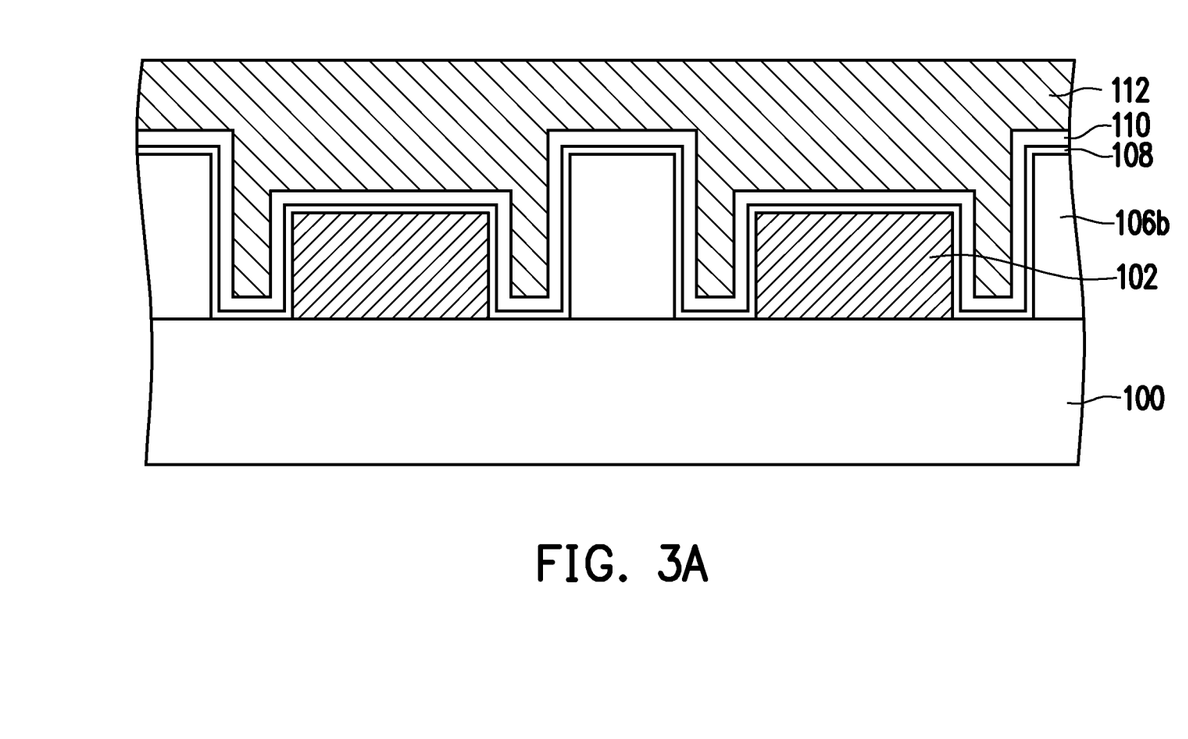
FIG. 3A to FIG. 3B are cross-sectional views of a manufacturing process of a resistive random access memory according to the second embodiment of the invention.
Figure 3B:
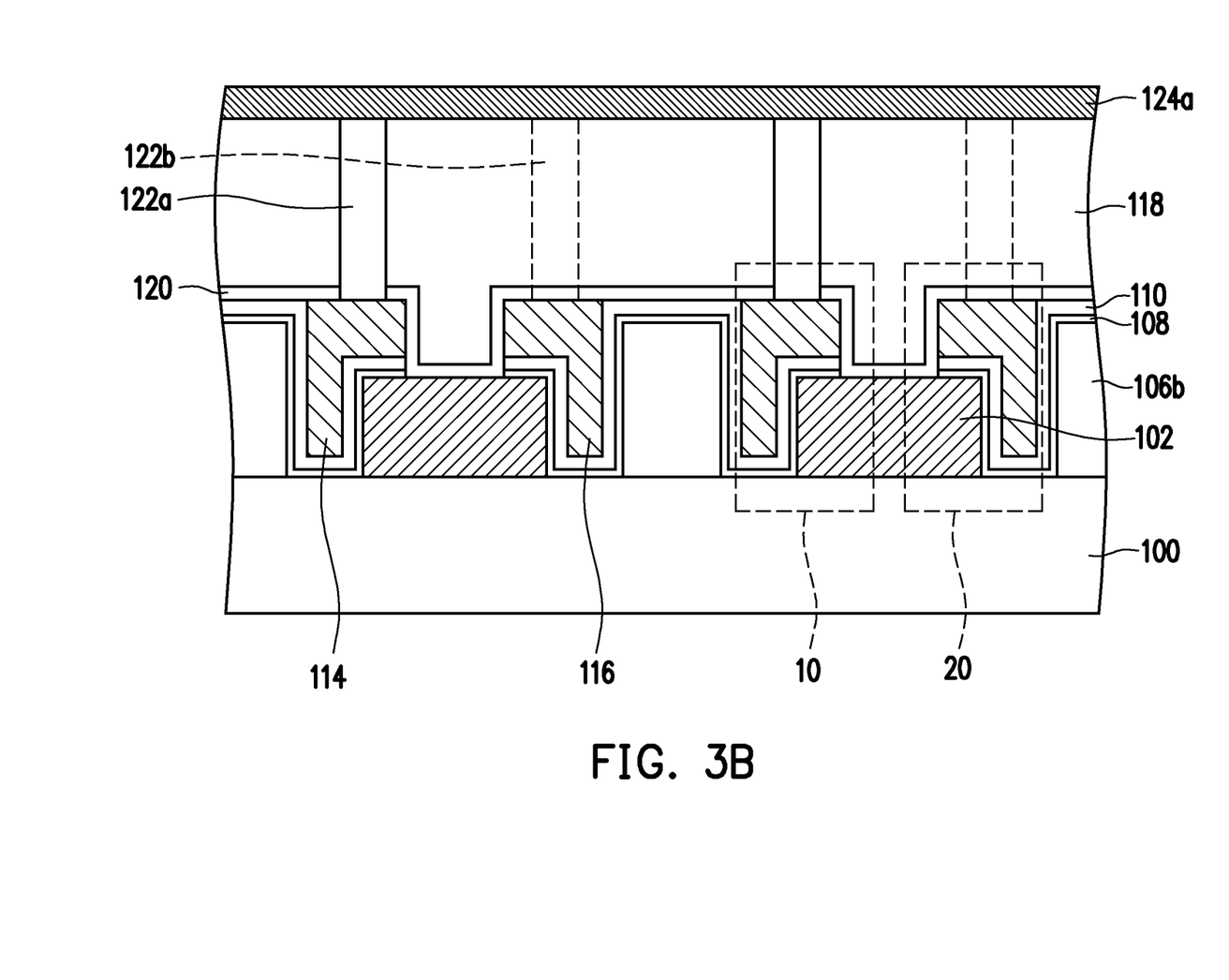

FIG. 3A to FIG. 3B are cross-sectional views of a manufacturing process of a resistive random access memory according to the second embodiment of the invention. In the present embodiment, the same devices as the first embodiment are labeled with the same reference numerals and are not repeated herein.

Referring to FIG. 3A, during the patterning process in FIG. 1B, only the isolation layer 106b is formed and the isolation layer 106a is not formed on the top surface of the first electrode 102. Then, the selection layer 108, the variable resistance layer 110, and the electrode material layer 112 are sequentially formed.

Referring to FIG. 3B, a patterning process is performed to remove a portion of the electrode material layer 112, a portion of the variable resistance layer 110, and a portion of the selection layer 108 to expose a portion of the top surface of the first electrode 102. In this way, the second electrode 114 and the third electrode 116 separated from each other are formed on two opposite sides of the first electrode 102. Next, the oxygen blocking layer 120 and the dielectric layer 118 are sequentially formed, and a process as described in FIG. 1D is performed to form the resistive random access memory of the present embodiment.

In each of the above embodiments, the selection layer 108 is located between the variable resistance layer 110 and the first electrode 102, that is, the selection layer is located between the variable resistance layer 110 and the lower electrode, but the invention is not limited thereto. In other embodiments, the selection layer 108 may be located between the variable resistance layer 110 and the second electrode 114 and the third electrode 116, that is, the selection layer 108 may be located between the variable resistance layer 110 and the upper electrode. In this case, a selection layer may be formed on the variable resistance layer 110 after the variable resistance layer 110 is formed. Alternatively, in other embodiments, a selection layer may be simultaneously disposed between the variable resistance layer 110 and the lower electrode and between the variable resistance layer 110 and the upper electrode. The position and forming method of the selection layer are known to those skilled in the art and are not repeated herein.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A resistive random access memory, comprising:
   a first electrode disposed on a substrate;
   a second electrode and a third electrode disposed on the first electrode, wherein the second electrode and the third electrode are separated from each other and overlapped with a sidewall and a top surface of the first electrode;
   a variable resistance layer disposed between the first electrode and the second electrode and between the first electrode and the third electrode;
   a selection layer disposed between the variable resistance layer and the first electrode and/or between the variable resistance layer and the second electrode and the third electrode;
   a first bit line disposed on the second electrode and electrically connected to the second electrode via a first contact; and
   a second bit line disposed on the third electrode and electrically connected to the third electrode via a second contact.

2. The resistive random access memory of claim 1, further comprising an isolation layer disposed on the top surface of the first electrode and located between the second electrode and the third electrode.

3. The resistive random access memory of claim 2, wherein the variable resistance layer covers the isolation layer, and the selection layer is provided between the variable resistance layer and the isolation layer.

4. The resistive random access memory of claim 1, further comprising a dielectric layer disposed between the second electrode and the first bit line and between the third electrode and the second bit line, and the first contact and the second contact are located in the dielectric layer.

5. The resistive random access memory of claim 4, further comprising an oxygen barrier layer disposed between the dielectric layer and the variable resistance layer.

6. A manufacturing method of a resistive random access memory, comprising:
   forming a first electrode on a substrate;
   forming a selection layer on the first electrode;
   forming a variable resistance layer on the selection layer;
   forming a second electrode and a third electrode separated from each other on the variable resistance layer, wherein each of the second electrode and the third electrode is overlapped with a sidewall and a top surface of the first electrode;
   forming a first contact on the second electrode;
   forming a second contact on the third electrode;
   forming a first bit line on the first contact; and
   forming a second bit line on the second contact.

7. The manufacturing method of the resistive random access memory of claim 6, further comprising, after the first electrode is formed and before the selection layer is formed, forming an isolation layer on the top surface of the first electrode.

8. The manufacturing method of the resistive random access memory of claim 7, wherein a forming method of the second electrode and the third electrode comprises:
   forming an electrode material layer on the variable resistance layer; and
   performing a planarization process to remove a portion of the electrode layer until the variable resistance layer on the isolation layer is exposed.

9. The manufacturing method of the resistive random access memory of claim 6, further comprising, after the second electrode and the third electrode are formed and before the first contact and the second contact are formed, forming a dielectric layer on the second electrode and the third electrode, and the first contact and the second contact are formed in the dielectric layer.

10. The manufacturing method of the resistive random access memory of claim 9, further comprising, after the second electrode and the third electrode are formed and before the dielectric layer is formed, forming an oxygen barrier layer on the variable resistance layer.

* * * * *